(12) United States Patent
Yamaguchi et al.

(10) Patent No.: US 7,491,981 B2
(45) Date of Patent: Feb. 17, 2009

(54) LIGHT-EMITTING DEVICE AND GLASS SEAL MEMBER THEREFOR

(75) Inventors: Seiji Yamaguchi, Aichi-ken (JP); Yoshinobu Suehiro, Aichi-ken (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 81 days.

(21) Appl. No.: 11/218,530

(22) Filed: Sep. 6, 2005

(65) Prior Publication Data

US 2006/0049423 A1 Mar. 9, 2006

(30) Foreign Application Priority Data

Sep. 7, 2004 (JP) ............................. 2004-260163

(51) Int. Cl.
*H01L 33/00* (2006.01)
(52) U.S. Cl. ........................................ 257/100; 257/99
(58) Field of Classification Search ............ 257/98–100
See application file for complete search history.

(56) References Cited

U.S. PATENT DOCUMENTS

| | | | | |
|---|---|---|---|---|
| 5,529,959 | A * | 6/1996 | Yamanaka | 438/64 |
| 6,274,927 | B1 * | 8/2001 | Glenn | 257/680 |
| 6,614,358 | B1 * | 9/2003 | Hutchison et al. | 340/815.45 |
| 6,924,514 | B2 * | 8/2005 | Suenaga | 257/98 |
| 2003/0038346 | A1 * | 2/2003 | Beer et al. | 257/666 |
| 2004/0004435 | A1 * | 1/2004 | Hsu | 313/512 |
| 2004/0061433 | A1 * | 4/2004 | Izuno et al. | 313/498 |
| 2004/0079957 | A1 * | 4/2004 | Andrews et al. | 257/100 |
| 2004/0169466 | A1 | 9/2004 | Suehiro | |
| 2005/0072981 | A1 * | 4/2005 | Suenaga | 257/88 |

FOREIGN PATENT DOCUMENTS

| | | |
|---|---|---|
| JP | U-62-84942 | 5/1987 |
| JP | 11-204838 | 7/1999 |
| JP | 2003318448 | * 11/2003 |
| JP | 2004-207367 | 7/2004 |

OTHER PUBLICATIONS

Japanese Office Action dated Aug. 26, 2008 (with partial English translation).

* cited by examiner

*Primary Examiner*—David Vu
*Assistant Examiner*—Andres Lopez Esquerra
(74) *Attorney, Agent, or Firm*—McGinn IP Law Group, PLLC

(57) ABSTRACT

A light-emitting device has a light-emitting portion having a light-emitting element; a heat dissipation base on which is mounted the light-emitting portion and which is exposed outwardly for dissipating heat produced by the light-emitting portion; a power feeding portion for feeding power to the light-emitting portion; and a sealing portion formed of a glass material being integral with the heat dissipation base for insulating the power feeding portion from the heat dissipation base.

13 Claims, 13 Drawing Sheets

LIGHT-EMITTING DEVICE AND GLASS SEAL MEMBER THEREFOR

The present application is based on Japanese patent application No. 2004-260163, the entire contents of which are incorporated herein by reference.

BACKGROUND OF THE INVENTION

1. Field of the Invention

The present invention relates to a light-emitting device using a light-emitting diode as a light source, and particularly, to a light-emitting device which is excellent in productivity as well as light resistance, moisture resistance, heat resistance, and heat dissipation.

2. Description of the Related Art

As conventional representative light-emitting devices using a light-emitting diode (LED) element as a light source, there are light-emitting devices in which an LED element and specified portion of leads (power-feeding members) are integrally sealed with a sealing material having light transmissivity. As such sealing materials, there are generally used sealing materials of resin, such as epoxy resin, silicon resin, or the like, from the points of view of molding property, mass productivity, and cost.

In recent years, blue LEDs with as high brightness as that of red and green LEDs have been developed, and thereby used in applications of LED traffic lights, white LEDs, and the like. Also, in order to obtain higher brightness, the development of high-power LEDs has proceeded, and high-power LEDs of a few watts have already been manufactured. In high-power LED elements, large current flows therethrough so that, from the points of view of light-emitting property and durability, an unnegligible level of heat is produced.

In such LEDs, resin sealing materials have large thermal expansion coefficient, so that increasing heat with increasing power and light of LED elements causes an increase in internal stress due to thermal expansion, and therefore cracking in the package, and peeling resulting from thermal expansion differences between the members. There is also the disadvantage of fast optical deterioration in resin sealing materials, such as yellowing. Because particularly in high-power LEDs, the above-mentioned tendencies are developed notably, LEDs with excellent durability are desired.

To improve such optical deterioration, heat resistance, and durability of LEDs, Japanese patent application laid-open No. 11-204838, for example, discloses using glass material as the sealing material.

According to the conventional light-emitting device, because sealing LED elements, etc. with glass generally requires softening and thermocompression-bonding glass material, or fusing and molding glass for being integral with the LED elements, etc., the portions to be sealed expand thermally due to exposure to heat during the processing, and are formed integrally and with no stress in this state, which is returned to normal temperature. In this case, however, if the thermal expansion coefficient differences between the LED elements and mounting substrate, etc. are large, there are the problems that peeling thereof is caused in the mounting interface by thermal stress due to the thermal contraction differences, and that cracking is caused in the sealing glass material, which reduce reliability.

SUMMARY OF THE INVENTION

It is an object of the present invention to provide a light-emitting device, which has excellent reliability and good capability of being processed, and which is excellent in light resistance, moisture resistance, heat resistance, and heat dissipation.

According to the invention, a light-emitting device comprises:

a light-emitting portion comprising a light-emitting element;

a heat dissipation base on which the light-emitting portion is mounted and which is exposed outwardly for dissipating heat produced by the light-emitting portion;

a power feeding portion for feeding power to the light-emitting portion; and a sealing portion that is made of a glass material and is integral with the heat dissipation base for insulating the power feeding portion from the heat dissipation base.

It is preferred that the sealing portion comprises:

a first sealing portion that is made of the glass material and is disposed between the heat dissipation base and the power feeding portion for insulation therebetween;

a second sealing portion that is made of the glass material and is integrated through the power feeding portion with the first sealing portions, the glass material having light transmissivity for radiating outwardly light emitted from the light-emitting portion; and a stress buffer portion that is disposed at the periphery of the light-emitting portion.

It is preferred that the light-emitting portion comprises the light-emitting element mounted on a submount.

It is preferred that the power feeding portion is in the form of a conductive thin film.

It is preferred that the sealing portion comprises a suppression portion that prevents the diffusion of a buffering material to flow out from the stress buffer portion through an interface between the first and the second sealing portions.

It is preferred that the first sealing portion is molded beforehand.

It is preferred that the heat dissipation base, the power feeding portion and the sealing portion have substantially the same thermal expansion coefficient.

It is preferred that the power feeding portion comprises a soft metal.

It is preferred that the heat dissipation base comprises a material with a thermal conductivity of 100 W/(m·K) or more.

It is preferred that the heat dissipation base comprises a copper alloy.

In the present invention, it is possible to provide a light-emitting device, which has excellent reliability and good capability of being processed, and which is excellent in light resistance, moisture resistance, heat resistance, and heat dissipation.

BRIEF DESCRIPTION OF THE DRAWINGS

The preferred embodiments according to the invention will be explained below referring to the drawings, wherein:

FIG. 12A is a plan view of the submount with the LED elements mounted thereon, and FIG. 12B is a partial cross-sectional view illustrating the packaged state of the LED elements and the submount of FIG. 12A; FIG. 13A is a vertical cross-sectional view and FIG. 13B is a sectional view along line B-B of FIG. 13A.

DETAILED DESCRIPTION OF THE PREFERRED EMBODIMENTS

Embodiment 1

Figure 1:
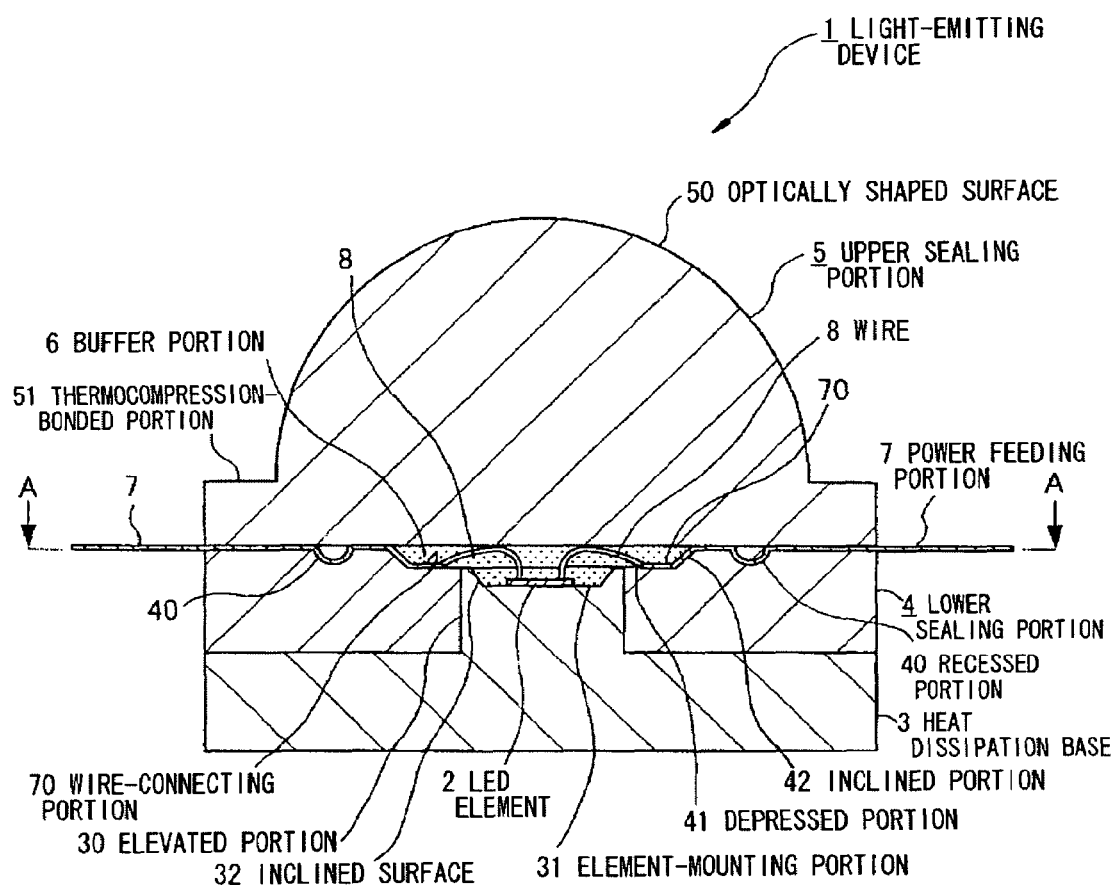
FIG. 1 is a vertical cross-sectional view illustrating the configuration of a light-emitting device in a first preferred embodiment according to the invention.
Figure 2:
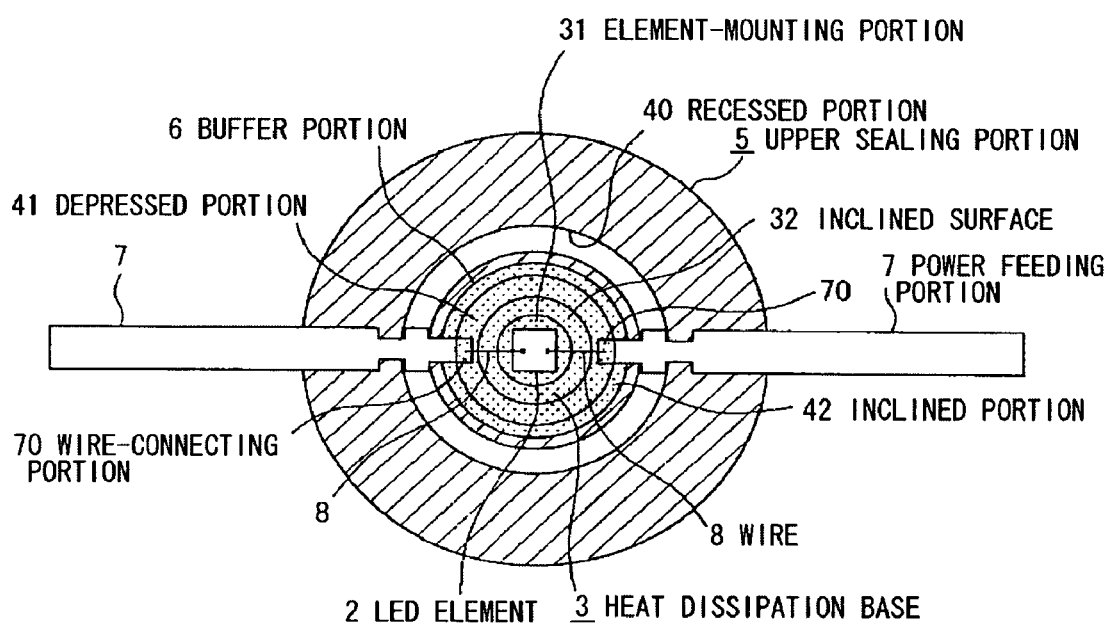
FIG. 2 is a sectional view along line A-A of FIG. 1.

FIG. 1 is a vertical cross-sectional view illustrating the configuration of a light-emitting device in the first preferred embodiment according to the invention, and FIG. 2 is a sectional view along line A-A of FIG. 1. This light-emitting device 1 comprises an LED element 2 for emitting light radiation as a light-emitting portion; a heat dissipation base 3 provided at the bottom of the light-emitting device 1 so as to expose its heat dissipation surface and having an element-mounting portion 31 for mounting the LED element 2; a lower sealing portion 4 provided to engage an elevated portion 30 of the heat dissipation base 3 and formed of a transparent glass material having light transmissivity; an upper sealing portion 5 for being thermocompression-bonded integrally with the upper portion of the lower sealing portion 4 and formed of a transparent glass material having light transmissivity for radiating light radiated from the LED element 2, outwardly from an optically shaped surface 50; a buffer portion 6 formed of a silicon resin sealing the space formed adjacent to the LED element 2 and between the lower and upper sealing portions 4 and 5 for buffering stress which acts on the LED element 2; power feeding portions 7 formed in a thin film shape for being interposed between the lower and upper sealing portions 4 and 5 for feeding power to the LED element 2; and wires 8 made of Au for connecting electrically the power feeding portions 7 and the electrodes of the LED element 2.

The LED element 2 is a GaN-based LED element formed by crystalline growth of a group III nitride-based compound semiconductor layer on a sapphire substrate as a base substrate, and has a thermal expansion coefficient of 4.5-6 ($\times 10^{-6}$/° C.). This LED element 2 is fixed to the element-mounting portion 31 of the heat dissipation base 3 with an adhesive not shown, and the light emission wavelength of light radiated from the light emission layer is 460 nm.

The group III nitride-based compound semiconductor layer may be formed by any known growth method, such as metal oxide chemical vapor deposition (MOCVD, also called MOVPE (metal organic vapor phase epitaxy)), molecular beam epitaxy (MBE), halide vapor phase epitaxy (HVPE), sputtering, ion plating, electron shower, etc. Further, the LED element 2 may comprise a homostructure, heterostructure, or double heterostructure LED, or a single or multiple quantum well LED.

The heat dissipation base 3 is formed in a circular shape and of copper alloy (thermal conductivity: 400 W/(m·K)) close to pure copper which is excellent in heat dissipation. The heat dissipation base 3 has an element-mounting portion 31 formed in a recessed shape in an upper portion of the elevated portion 30, and an inclined surface 32 formed around the element-mounting portion 31, where heat produced by the LED element 2 is dissipated outwardly from its bottom and sides by thermal conduction. Further, the heat dissipation base 3 may be surface-plated with lustrous Ag, or the like, or be formed by another metal material (Al, for example), or a material other than metal materials, provided that it has excellent thermal conductivity and dissipation (a thermal conductivity of 100 W/(m·K) or more, preferably 200 W/(m·K) or more).

The inclined surface 32 is formed in such a manner that light radiated sideways from the LED element 2 is incident on the optically shaped surface 50 of the upper sealing portion 5 by being reflected off the inclined surface 32.

The lower sealing portion 4 is formed of low melting point $P_2O_5$—F-based glass (thermal expansion coefficient: $16.5 \times 10^{-6}$/° C., transition temperature Tg: 325° C., refractive index n: 1.5), and in a cylindrical shape with the same diameter as that of the heat dissipation base 3, and has a hole cut at the center in which is fitted the elevated portion 30 of the heat dissipation base 3. It also has a recessed portion 40 for stemming silicon resin leaked out of the buffer portion 6 when thermocompression-bonded to the upper sealing portion 5, a depressed portion 41 for being depressed relative to the bonding interface with the upper sealing portion 5 around the element-mounting portion 31 of the heat dissipation base 3, and an inclined portion 42 formed around the depressed portion 41. The lower sealing portion 4 is integral with the upper sealing portion 5 and the heat dissipation base 3 by thermocompression bonding.

As shown in FIG. 2, the recessed portion 40 is formed in an annular shape around the heat dissipation base 3, for preventing silicon resin leaked out of the buffer portion 6 from being leaked out of the recessed portion 40, thereby preventing bonding strength degradation of the lower and upper sealing portions 4 and 5 and the power feeding portions 7.

The upper sealing portion 5 is formed of the same $P_2O_2$—F-based glass as that of the lower sealing portion 4, and has an optically shaped portion 50 processed in a semi-spherical shape beforehand, and a thermocompression-bonded portion 51 formed in an annular shape around the optically shaped portion 50, for being thermocompression-bonded to the lower sealing portion 4 with a mold which will be described later, to thereby be integral therewith. The optically shaped portion 50 is in a semi-spherical shape for collecting light, but may have any other shape for collecting or diffusing light.

The buffer portion 6 is formed of a silicon resin for protecting the LED element 2 and the wires 8 provided between the lower and upper sealing portions 4 and 5. The silicon resin may be caused to contain a fluorescent material to be excited by light radiated from the LED element 2.

The power feeding portions 7 are formed of a 50 μm or less thick Cu thin film and in a shape matching the recessed portion 40, the depressed portion 41, and the inclined portion 42, by being thermocompression-bonded to the lower sealing portion 4 with a mold.

The wires 8 are respectively connected to the electrodes of the LED element 2 and wire-connecting portions 70 of the power feeding portions 7 positioned in the depressed portion 41 of the lower sealing portion 4.

A method for fabricating the light-emitting device 1 of the first embodiment will be explained below.

Figure 3A:
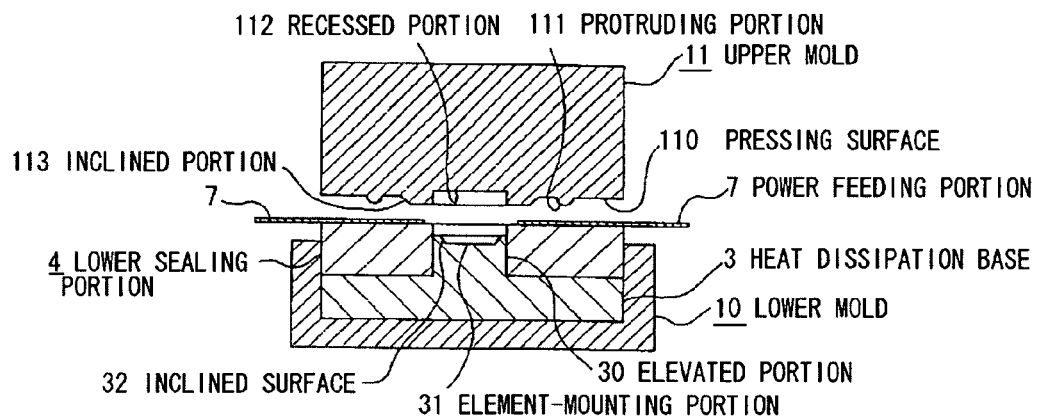
FIGS. 3A-3C are explanatory views illustrating the step of processing a heat dissipation base and a lower sealing portion of the light-emitting device.
Figure 3B:
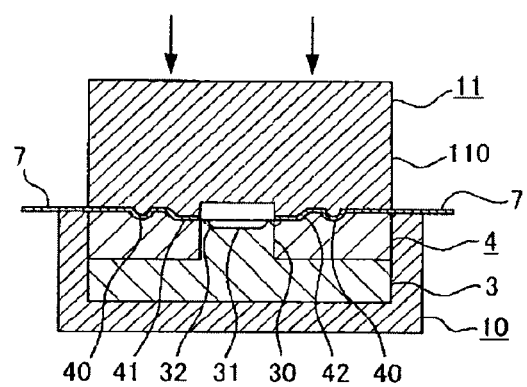
Figure 3C:
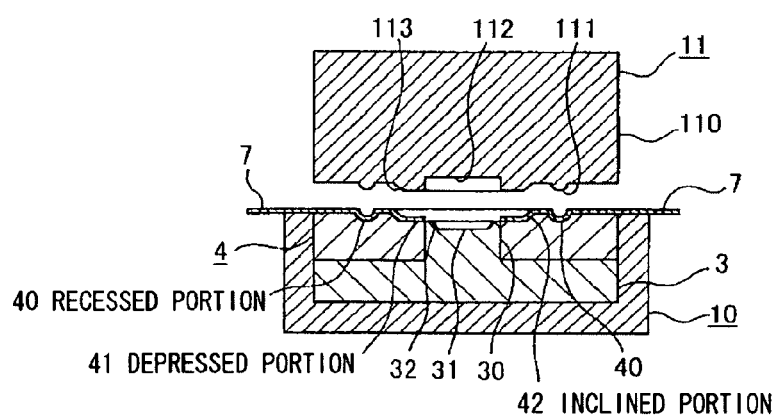

FIGS. 3A-3C are explanatory views illustrating the step of processing the heat dissipation base 3 and the lower sealing portion 4 of the light-emitting device 1. First, as shown in FIG. 3A, the heat dissipation base 3 and the lower sealing portion 4 are set sequentially in a lower mold 10. Next, copper foil that serves as the power feeding portions 7 is positioned and disposed on the surface of the lower sealing portion 4. Next, an upper mold 11 is prepared. The upper mold 11 has a protruding portion 111, a recessed portion 112, and an inclined portion 113 in a pressing surface 110.

Next, as shown in FIG. 3B, the upper mold 11 is heated to about 325° C., and lowered from above the lower sealing portion 4 and the copper foil so that the pressing surface 110 is brought into close contact with and caused to press them with a specified weight for a given length of time. This heating press allows simultaneously the thermocompression bonding of the heat dissipation base 3 and the lower sealing portion 4, the indentation molding of the pattern to the surface of the lower sealing portion 4 matching the shape of the pressing surface 110, and the formation of the power feeding portions 7 by the thermocompression bonding of the copper foil.

Next, as shown in FIG. 3C, the upper mold 11 is separated therefrom, and the heat dissipation base 3 and the lower sealing portion 4 are taken out from the lower mold 10.

Figure 4A:
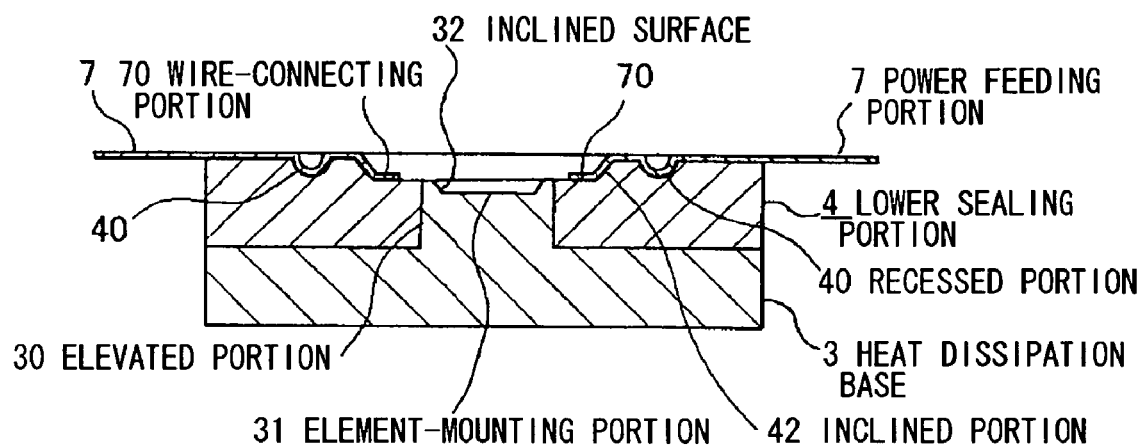
FIGS. 4A and 4B are cross-sectional views illustrating the heat dissipation base and the lower sealing portion made integral by a heating press.
Figure 4B:
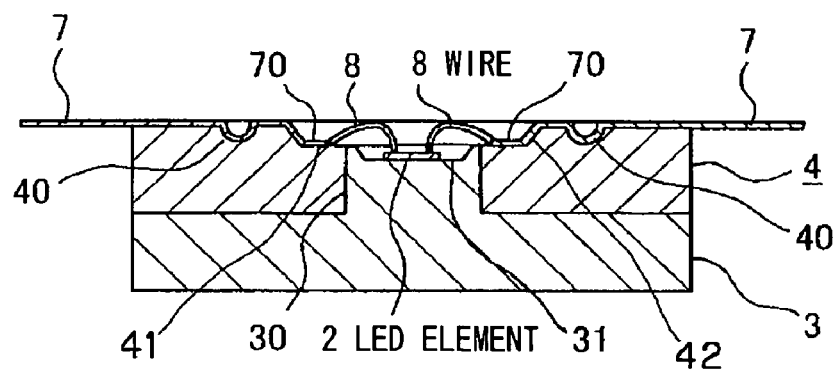

FIGS. 4A and 4B are cross-sectional views illustrating the heat dissipation base 3 and the lower sealing portion 4 made integral by the heating press. The lower sealing portion 4 shown in FIG. 4A is formed with the recessed portion 40 matching the pressing surface 110 of the upper mold 11, the depressed portion 41, and the inclined portion 42, along with the power feeding portions 7, explained in FIG. 3.

FIG. 4B is an explanatory view illustrating the step of mounting an LED element in the element-mounting portion of the heat dissipation base. In this element-mounting step, an LED element 2 is bonded to the element-mounting portion 31 of the heat dissipation base 3 by means of an epoxy-based adhesive. As the adhesive, another adhesive such as Ag-paste, etc. may be used. Next, the electrodes of the LED element 2 and wire-connecting portions 70 of the power feeding portions 7 provided in the depressed portion 41 are electrically connected to each other by means of Au-wires 8, respectively. In this case, the Au-wires 8 should not protrude from the top surface of the lower sealing portion 4.

Next, silicon resin that forms the buffer portion 6 is dripped from above to the LED element 2 and the Au-wires 8. The above-described element-mounting step is performed by taking out the heat dissipation base 3 and the lower sealing portion 4 from the lower mold 10, but may be performed with them housed in the lower mold 10.

Figure 5:
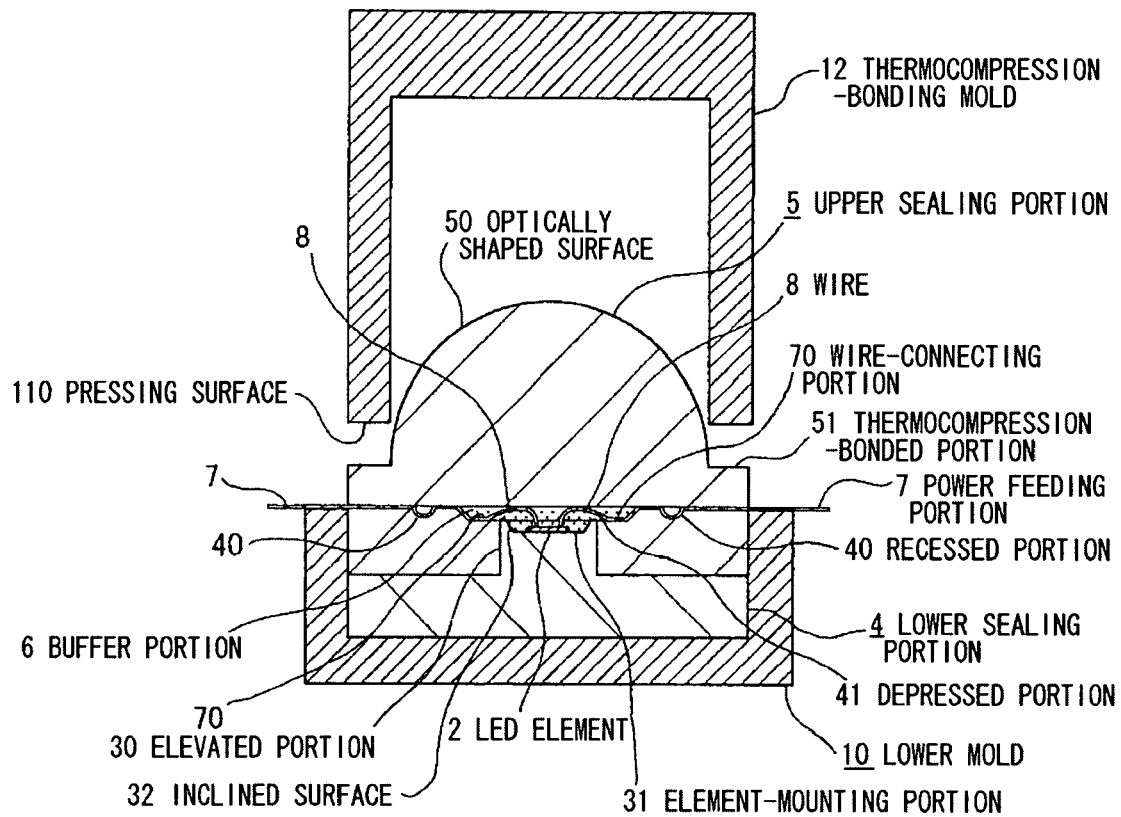
FIG. 5 is an explanatory view illustrating the step of thermocompression-bonding the heat dissipation base and the lower sealing portion and the upper sealing portion.

FIG. 5 is an explanatory view illustrating the step of thermocompression-bonding the heat dissipation base and the lower sealing portion and the upper sealing portion. In this thermocompression-bonding step, the heat dissipation base 3 and the lower sealing portion 4 are first again housed in the lower mold 10, and the upper sealing portion 5 molded so as to have the optically shaped surface 50 beforehand is mounted on the lower sealing portion 4. Next, a thermocompression-bonding mold 12 is prepared. The upper mold 11 is held at 360° C. and the lower mold 10 at 300° C. The pressing surface 110 is heated to about 350° C., positioned to the thermocompression-bonded portion 51 formed around the rim of the upper sealing portion 5, and lowered so as to be caused to press the thermocompression-bonded portion 51 with a specified weight for a given length of time. This heating press allows the upper sealing portion 5 to be thermocompression-bonded annularly to the lower sealing portion 4 matching the shape of the thermocompression-bonded portion 51.

In this case, even if silicon resin is leaked out of the buffer portion 6 so as to flow between the upper and lower sealing portions 5 and 4, the silicon resin leaked is received in the recessed portion 40 formed so as to annularly surround the buffer portion 6, thereby suppressing diffusion to the vicinity of the thermocompression-bonded portion 51.

The heating press may be performed at the same temperature of the lower and upper molds 10 and 11.

The operation of the light-emitting device 1 of the first embodiment will be explained below.

By connecting the power feeding portions 7 to a power supply not shown and causing current to flow therethrough, the current is caused to flow from the wire-connecting portions 70 through the electrodes of the LED element 2 to the light-emitting layer. The light-emitting layer emits blue light in response to current conduction therethrough. This blue light is passed from the electrode formation surface through the buffer portion 6 to the upper sealing portion 5, and radiated outwardly from the upper sealing portion 5 through the optically shaped surface 50.

The effects of the first embodiment are as follows.

(1) Since the sealing portion formed of low melting point glass (inorganic material) is provided on the heat dissipation base 3 for insulating the power feeding portions 7 from the heat dissipation base 3 and sealing the LED element 2, the LED element 2 and the wires 8 can be protected from damage due to heat, and have durability against optical deterioration and moisture resistance. Also, since the heat dissipation base 3 is formed of a high thermal conductivity member and in the area-widening shape of the heat dissipation path in the heat dissipation direction from the LED element 2, and is exposed outwardly in the portions of its side surfaces and at the bottom, heat produced by the LED element 2 can be rapidly dissipated outwardly. Particularly, in the GaN-based LED element 2, because its light-emitting power decrease is caused mainly by deterioration of the sealing portion, glass sealing is used, thereby allowing obtaining a light-emitting device 1 whose power degradation is very small.

(2) Since the LED element 2 is sealed with the buffer portion 6 made of silicon resin and the upper and lower sealing portions 5 and 4 are integral with each other by thermocompression-bonding, heat and external force produced in glass sealing can be prevented from affecting directly the LED element 2, thereby allowing a less incidence of damage of the LED element 2 during processing. Also, since high viscosity ($10^4$-$10^9$ poises) glass at very low temperatures is used for thermocompression-bonding and sealing the LED element 2, problems with the concept of glass sealing of LEDs that could not hitherto be materialized are overcome. Silicon resin used is caused to fill the sealing space in only the small portion around the element. For this reason, the internal stress of high thermal expansion coefficient silicon resin is negligible.

(3) Since the power feeding portions 7 are formed of copper foil, their shape can be processed simultaneously during processing of the lower sealing portion 4, thereby allowing ensuring simplification of the fabrication process. Also, in high viscosity glass processing, there can be a less incidence of unbonded portion to glass which tends to occur at the electrode side surfaces. Further, the thin-film power feeding portions 7 allows having excellent capability of being bonded to glass material, a less incidence of peeling due to thermal expansion/contraction, excellent reliability, capability of flexibly matching complicated wiring patterns, and an excellent design freedom degree.

(4) Silicon resin caused to flow through the interface during thermocompression-bonding of the upper and lower sealing portions 5 and 4 is received by the recessed portion 40, so that no silicon resin can leak out of the recessed portion 40, thereby allowing ensuring the glass bonding property.

(5) Since $P_2O_2$—F-based glass is used, even $P_2O_2$-based glass can be caused to have very high durability and weather resistance by the water-repellent effect of fluorine.

(6) Since the LED element 2 and the Au-wires 8 are sealed with glass material, they can be unaffected by moisture.

(7) Because of the structure using only the high heat-resistance members, heat treatment can be performed adequately even in a lead-free reflow furnace.

(8) Since the fabrication process is managed for unit member, i.e., integration of the heat dissipation base 3, lower sealing portion 4 and power feeding portions 7, mounting of the LED element 2, formation of the buffer portion 6, and thermocompression-bonding of the upper sealing portion 5, the fabrication management can be facilitated, and high-precision light-emitting device fabrication can be realized.

(9) Since the upper sealing portion 5 is thermocompression-bonded at its rim and thereby made integral with the lower sealing portion 4, heat produced by the thermocompression-bonding of the upper sealing portion 5 is difficult to be conducted to the LED element 2, which thus allows preventing thermal destruction of the LED element 2 during sealing.

Further, the glass material used in the upper and lower sealing portions 5 and 4 may be any glass material that can be processed at a temperature of not higher than 400° C. at which the LED element 2 is not destroyed, and at which the silicon resin of the buffer portion 6 is not pyrolyzed. As such glass material, there is silicate-based glass, for example, which exhibits good capability of being joined to soft metal so as to withstand thermal-shock tests in a wide range because of its plastic deformation even in the case of a large thermal expansion coefficient difference therebetween.

Also, in the first embodiment, although the upper and lower sealing portions 5 and 4 are formed of transparent glass material, the lower sealing portion 4 may be formed of white glass material, for example. In this case, light which is totally reflected off the optically shaped surface 50 of the upper sealing portion 5 and arrives at the lower sealing portion 4, is scattered by the white glass and thereby radiated outwardly.

Also, the lower sealing portion 4 may be formed of black glass material and the upper sealing portion 5 may be formed of transparent glass material, according to the use of the light-emitting device 1. For instance, in the applications of traffic lights, etc., where the light-emitting device 1 is lit on and off, the black color around the LED element 2 is visible when the light-emitting device 1 is off, and the blue luminescent color is visible when the light-emitting device 1 is on, which results in a definite contrast between on and off of the light-emitting device 1, and therefore enhancement in visibility.

Also, the upper sealing portion 5 may be caused to contain a fluorescent material excited by the light emission wavelength of the LED element 2. In this case, the light-emitting device 1 may be of a wavelength conversion type. Also, the fluorescent material may be formed in a thin film shape on the optically shaped surface 50 instead of being contained in the upper sealing portion 5.

Also, although the first embodiment has explained the light-emitting device 1 using the GaN-based LED element 2, the LED element 2 is not limited thereto, but may be another LED element 2 such as a GaP-based or GaAs-based LED element, or the like.

Embodiment 2

Figure 6:
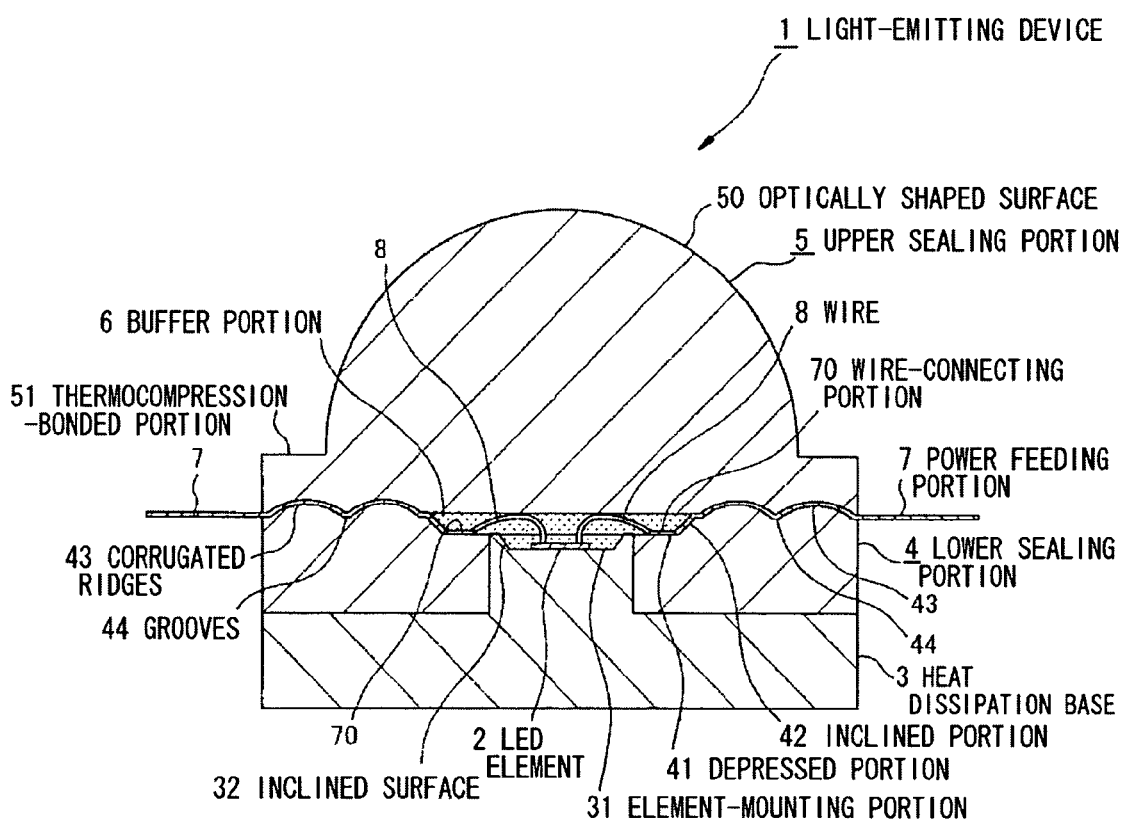
FIG. 6 is a vertical cross-sectional view illustrating the configuration of a light-emitting device in a second preferred embodiment according to the invention.

FIG. 6 is a vertical cross-sectional view illustrating the configuration of a light-emitting device in the second preferred embodiment according to the invention. This light-emitting device 1 is different from that of the first embodiment in structure having corrugated ridges 43 with a groove 44 in place of the recessed portion 40 formed in the lower sealing portion 4 of the light-emitting device 1 explained in the first embodiment. In the following embodiments, the same reference numbers as those of the first embodiment respectively denote the portions having the same structure and function as those in the first embodiment.

The corrugated ridges 43 are formed at the same time as thermocompression bonding of the power feeding portions 7 by the heating press of a mold as in the first embodiment. The groove 44 prevents diffusion to the rim, of silicon resin caused to flow through the interface during thermocompression bonding of the upper and lower sealing portions 5 and 4.

The effect of the second embodiment is as follows.

According to the second embodiment, since the corrugated ridges 43 are formed in the lower sealing portion 4 at the same time as thermocompression bonding of the power feeding portions 7 by the heating press, the silicon resin diffusion prevention structure can be formed during thermocompression bonding of the power feeding portions 7 without grooving the lower sealing portion 4 beforehand, thereby allowing simplification of the fabrication process, in addition to the favorable effects of the first embodiment.

Embodiment 3

Figure 7:
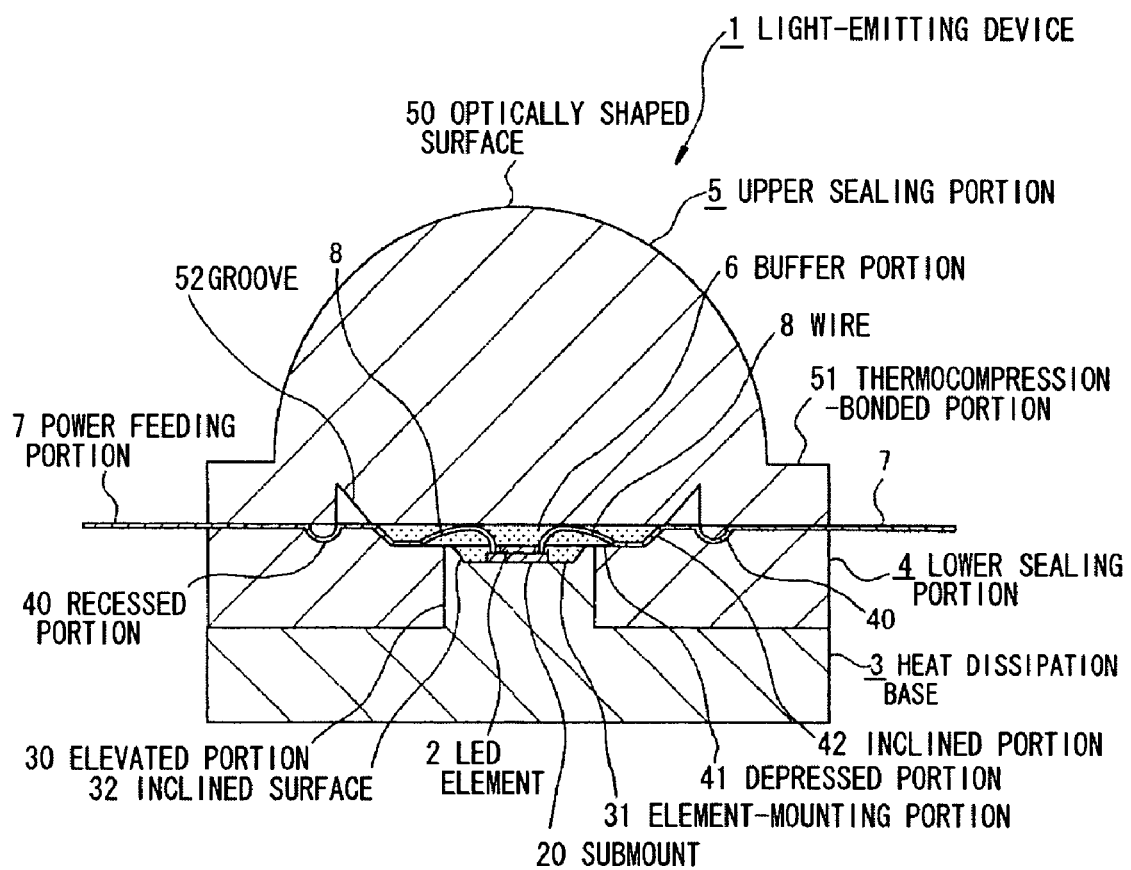
FIG. 7 is a vertical cross-sectional view illustrating the configuration of a light-emitting device in a third preferred embodiment according to the invention.

FIG. 7 is a vertical cross-sectional view illustrating the configuration of a light-emitting device in the third preferred embodiment according to the invention. This light-emitting device 1 is different from that of the first embodiment in that a groove 52 with a triangular cross-sectional shape is formed in the upper sealing portion 5 of the light-emitting device 1 explained in the first embodiment, and in that its light-emitting portion is made by flip chip packaging of an LED element 2 via a submount 20 made of AlN.

The groove 52 is formed in the bonding surface of the upper sealing portion 5 beforehand and is annularly provided on the LED element 2 side relative to the recessed portion 40 by thermocompression bonding the upper sealing portion 5 to the lower sealing portion 4. This groove 52 receives silicon resin leaked out of the buffer portion 6 similarly to the recessed portion 40, and totally reflects light passed from the LED element 2 through the buffer portion 6, towards the optically shaped surface 50, because of the refractive index difference at the interface of an air layer formed inside the groove 52, even if the silicon resin does not fill the groove 52.

The flip-chip packaging of the LED element 2 via the submount 20 allows the packaging of a large-size LED element 2.

The submount 20 has a wiring pattern formed within its layer not illustrated, with terminals respectively electrically connected to n-side and p-side electrodes of the LED element 2, and external connection terminals to which are bonded wires 8 connected to the power feeding portions 7.

The effect of the third embodiment is as follows.

According to the third embodiment, since the groove 52 with a triangular cross-sectional shape is formed in the upper sealing portion 5, its capability of preventing diffusion of silicon resin can be enhanced, in addition to the favorable effects of the first embodiment. Also, since light passed into the groove 52 is totally reflected therein and passed to the optically shaped surface 50, the outward radiation efficiency can be enhanced effectively.

Embodiment 4

Figure 8:
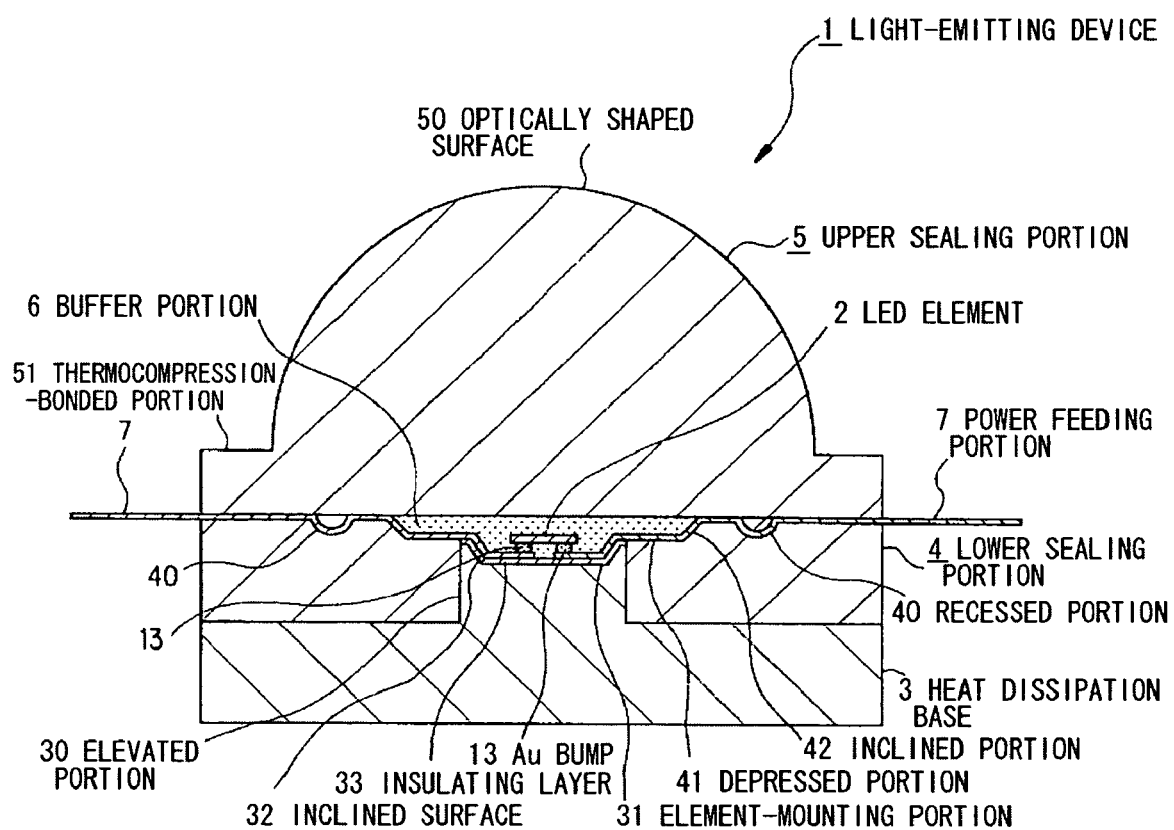
FIG. 8 is a vertical cross-sectional view illustrating the configuration of a light-emitting device in a fourth preferred embodiment according to the invention.

FIG. 8 is a vertical cross-sectional view illustrating the configuration of a light-emitting device in the fourth preferred embodiment according to the invention. This light-emitting device 1 is different from that of the first embodiment in structure having a large-size LED element 2 flip-chip-packaged in the element-mounting portion 31 of the light-emitting device 1 explained in the first embodiment, and an insulating layer 33 made of $SiO_2$ on the entire upper surface of the elevated portion 30 including the element-mounting portion 31 for the flip-chip packaging. The power feeding portions 7 are arranged and thermocompression-bonded so as to extend to the element-mounting portion 31 during thermocompression bonding of the heat dissipation base 3 and the lower sealing portion 4. The insulating layer 33 is not limited to $SiO_2$, but may be a combination of a heat-resistive insulating film, sheet, Al base and alumite, etc.

The effects of the fourth embodiment are as follows.

According to the fourth embodiment, since the power feeding portions 7 are provided in the element-mounting portion 31 provided with the insulating layer 33 for flip-chip-packaging the large-size LED element 2, wire bonding becomes unnecessary, thereby allowing ensuring simplification of the fabrication process and reduction of cost, in addition to the favorable effects of the first embodiment.

Also, the light-emitting device 1 can be of a wavelength conversion type by providing a fluorescent material layer on the surface of the flip-chip-packaged LED element 2 from which is derived light. Specifically, a fluorescent material made of Ce:YAG (Yttrium Aluminum Garnet) is dissolved in a binder and screen-printed on the surface of a sapphire substrate of the LED element 2, followed by about 150° C. heat treatment and subsequent removal of the binder, which results in a fluorescent material layer.

Embodiment 5

Figure 9:
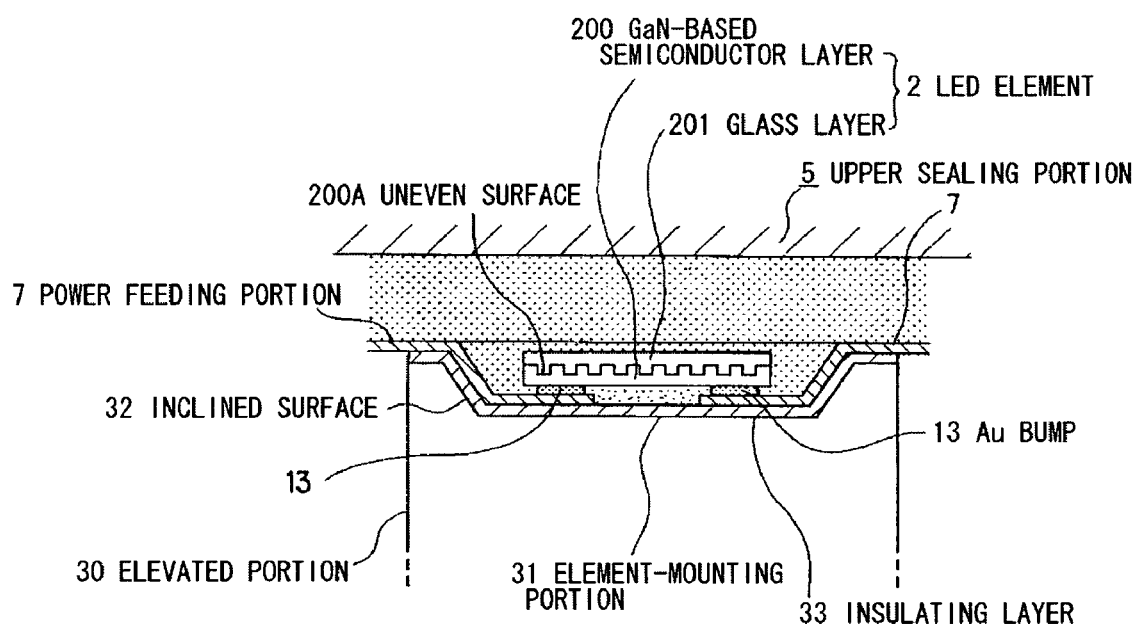
FIG. 9 is a partial cross-sectional view illustrating the configuration of an LED element in a fifth preferred embodiment according to the invention.

FIG. 9 is a partial cross-sectional view illustrating the configuration of an LED element in the fifth preferred embodiment according to the invention. This LED element 2 has an integral structure of a GaN-based semiconductor layer 200, and a glass layer 201 made of a low melting point glass with a refractive index of n=1.8, on the side of the GaN-based semiconductor layer 200 from which is derived light, and is flip-chip-packaged on power feeding portions 7 via an Au bump 13. Also, an uneven surface 200A is formed in the interface of the GaN-based semiconductor layer 200 and the glass layer 201 as a surface for deriving light from the GaN-based semiconductor layer 200. The other structure of the light-emitting device 1 is the same as in the fourth embodiment.

The uneven surface 200A serves to radiate outwardly light confined within the GaN-based semiconductor layer 200 without being radiated out therefrom. The uneven surface 200A is caused to have vertical side surfaces with a specified depth and spacing, in the exposed surface of the GaN-based semiconductor layer 200, by applying laser light from the sapphire substrate side of the LED element 2 to lift off the sapphire substrate.

The effect of the fifth embodiment is as follows.

According to the fifth embodiment, since the glass layer 201 is made integral with the GaN-based semiconductor layer 200 by lifting off the sapphire substrate and forming the uneven surface 200A in the exposed GaN-based semiconductor layer 200, it is possible to derive efficiently light confined within the GaN-based semiconductor layer 200 without being radiated out therefrom, thereby allowing enhancement of outward radiation efficiency.

Embodiment 6

Figure 10:
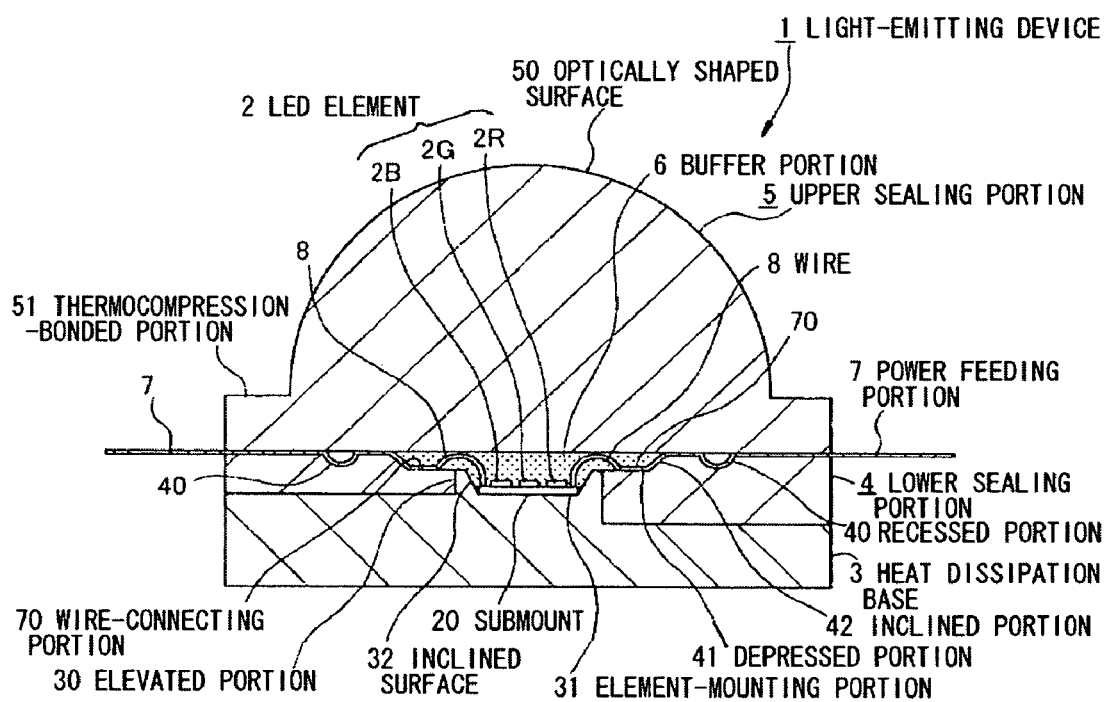
FIG. 10 is a vertical cross-sectional view illustrating the configuration of a light-emitting device in a sixth preferred embodiment according to the invention.

FIG. 10 is a vertical cross-sectional view illustrating the configuration of a light-emitting device in the sixth preferred embodiment according to the invention. This light-emitting device 1 is different from that of the first embodiment in structure having a plurality of LED elements 2 (2R, 2G, 2B) flip-chip-packaged via a submount 20 in the element-mounting portion 31 of the light-emitting device 1 explained in the first embodiment.

The LED elements 2 are packaged by combining red, green and blue light radiating LED elements. The submount 20 and power feeding portions 7 are electrically connected via wires 8, and its connection structure is the same as in the light-emitting device 1 explained in the third embodiment.

The effect of the sixth embodiment is as follows.

According to the sixth embodiment, since the plurality of LED elements 2 are packaged via the submount 20, the light amount of the light-emitting device 1 can be made large. It is also possible to dissipate heat caused by light emission through the heat dissipation base 3, and thereby handle high power applications sufficiently even in the case of the plurality of LED elements 2.

Also, since a plurality of LED elements 2 each having a different luminescent color may be combined and mounted, full color can be output. It is also possible to radiate white light without using any fluorescent material.

Embodiment 7

Figure 11:
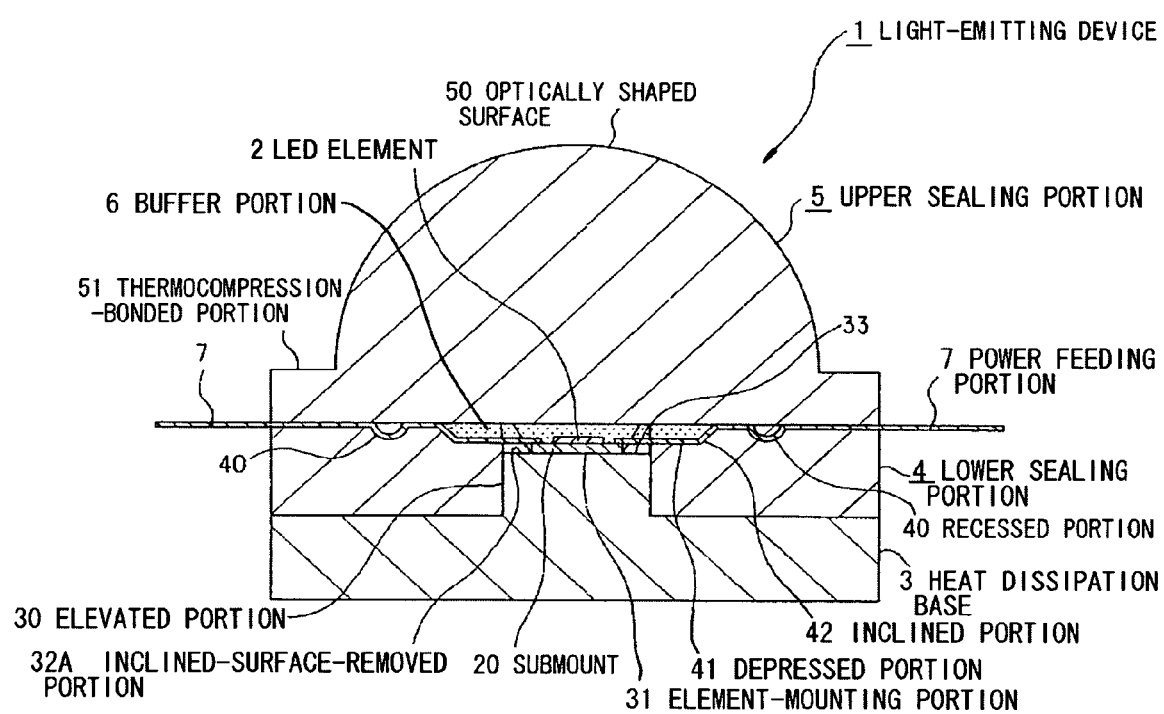
FIG. 11 is a vertical cross-sectional view illustrating the configuration of a light-emitting device in a seventh preferred embodiment according to the invention.

FIG. 11 is a vertical cross-sectional view illustrating the configuration of a light-emitting device in the seventh preferred embodiment according to the invention. This light-emitting device 1 is different from that of the first embodiment in structure having an LED element 2 flip-chip-packaged via a submount 20 in the element-mounting portion 31 of the light-emitting device 1 explained in the first embodiment, and external connection terminals and power feeding portions 7, which are formed on the submount 20, and electrically connected to each other. The structure of the submount 20 is the same as that explained in the third embodiment.

The heat dissipation base 3 has an inclined-surface-removed portion 32A formed by removing the inclined surface 32 on which is provided the power feeding portions 7, so as to avoid short-circuit between the heat dissipation base 3 and the power feeding portions 7. In the seventh embodiment, the submount 20 and the LED element 2 are fixed with an adhesive beforehand to the element-mounting portion 31 of the heat dissipation base 3, followed by applying a conductive adhesive to the external connection terminals of the submount 20, and subsequent heating press to make the lower sealing portion 4 and the power feeding portions 7 integral, and thereby electrically connect the external connection terminals of the submount 20 and the power feeding portions 7 via the conductive adhesive.

As the conductive adhesive, there may used an Ag paste, or an epoxy-based adhesive containing a conductive filler. This conductive adhesive may have light transmissivity.

The effect of the seventh embodiment is as follows.

According to the seventh embodiment, since the lower sealing portion 4 and the power feeding portions 7 are made integral relative to the heat dissipation base 3 with the LED element 2 mounted thereon, so that the LED element 2 and the power feeding portions 7 can be electrically connected to each other simultaneously, thereby allowing ensuring simplification of the fabrication process and reduction of cost.

Embodiment 8

Figure 12A:
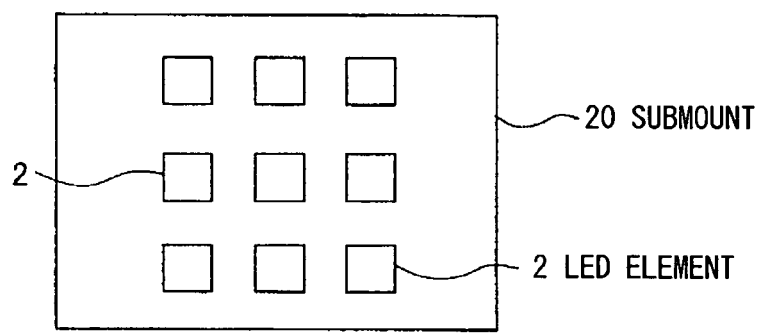
FIGS. 12A and 12B are explanatory views illustrating packaging of LED elements and a submount of a light-emitting device in an eighth preferred embodiment according to the invention, where
Figure 12B:
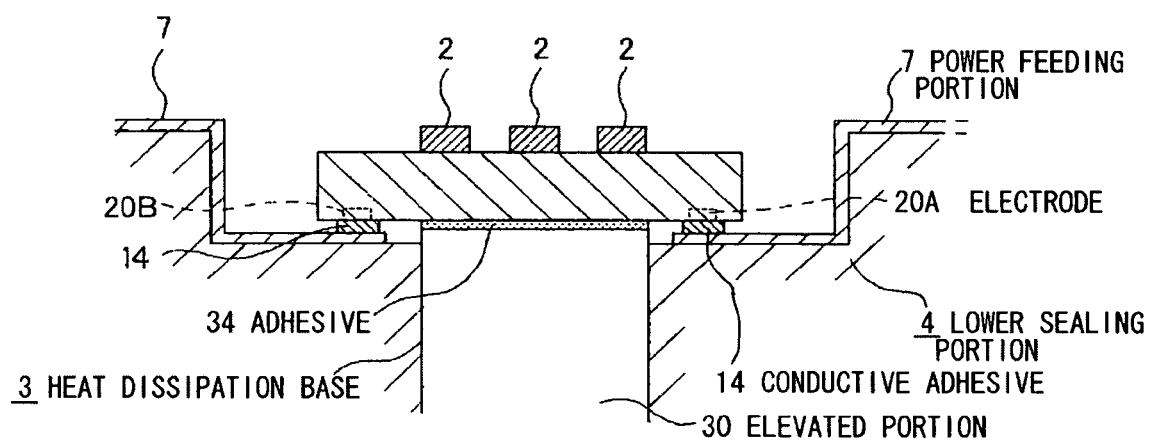

FIGS. 12A and 12B are explanatory views illustrating packaging of LED elements and a submount of a light-emitting device in the eighth preferred embodiment according to the invention, where FIG. 12A is a plan view of the submount with the LED elements mounted thereon, and FIG. 12B is a partial cross-sectional view illustrating the packaged state of the LED elements and the submount of FIG. 12A. In this light-emitting device 1, there is mounted a submount 20 having a plurality of LED elements 2 on top of a heat dissipation base 3 formed in a planar shape.

In the eighth embodiment, the lower sealing portion 4 and the power feeding portions 7 are first thermocompression-bonded to the heat dissipation base 3, as explained in the first embodiment. Next, a conductive adhesive 14 is applied to external connection terminals of the submount 20 with 9 LED elements flip-chip-mounted beforehand. Next, the submount 20 is positioned relative to the power feeding portions 7, and bonded to top of the heat dissipation base 3 via an epoxy-based adhesive 34. During this bonding of the submount 20, the external connection terminals are bonded to the power feeding portions 7 by the conductive adhesive 14, which thereby results in electrical connection.

The effect of the eighth embodiment is as follows.

According to the eighth embodiment, when the submount 20 is fixed to top of the heat dissipation base 3, electrical connection to the power feeding portions 7 is also made simultaneously, thereby allowing ensuring simplification of the fabrication process.

Embodiment 9

Figure 13A:
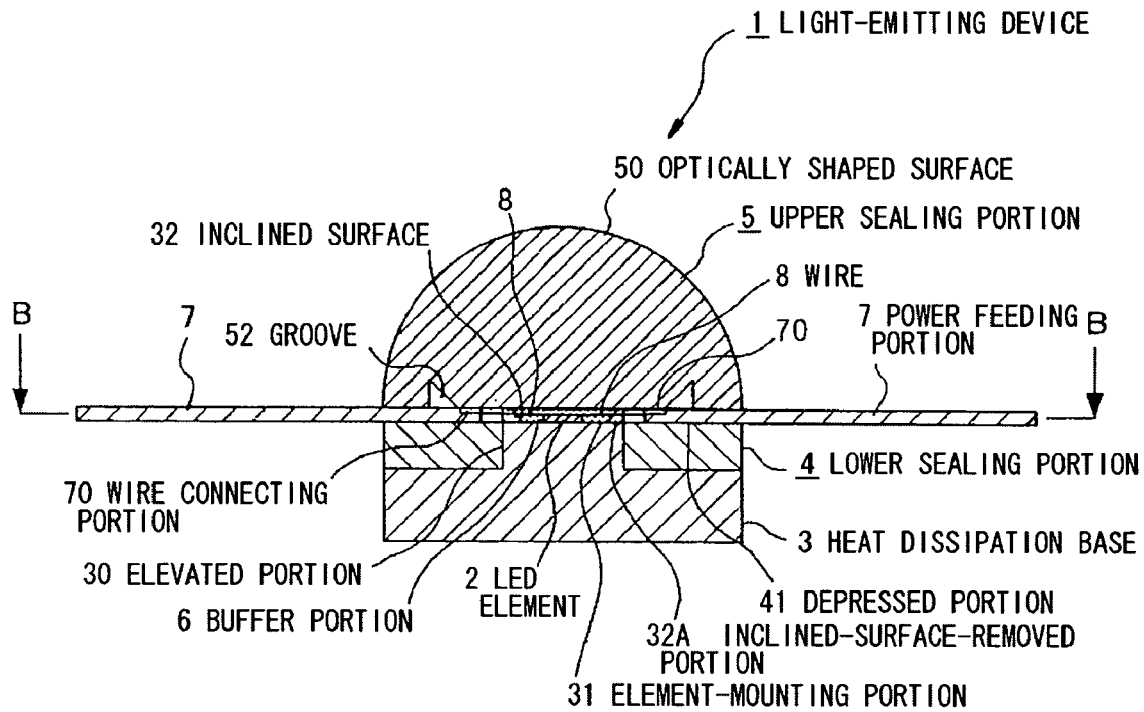
FIGS. 13A and 13B illustrate a light-emitting device in a ninth preferred embodiment according to the invention, where
Figure 13B:
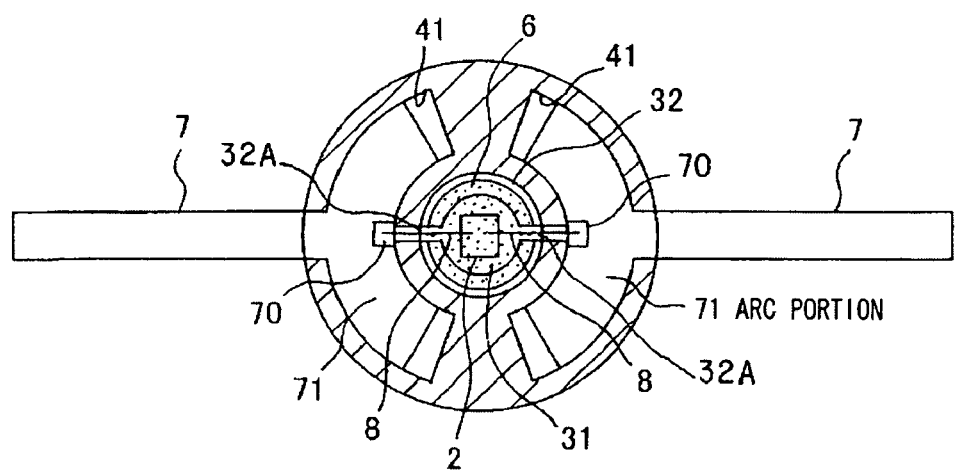

FIGS. 13A and 13B illustrate a light-emitting device in the ninth preferred embodiment according to the invention, where FIG. 13A is a vertical cross-sectional view and FIG. 13B is a sectional view along line B-B of FIG. 13A. This light-emitting device 1 is different from that of the first embodiment in structure, as shown in FIG. 13A, using power feeding portions 7 in a lead form made of copper alloy instead of Cu in a thin film form used as the power feeding portions 7 in the first to eighth embodiments; having no thermocompression-bonded portion 51 around the upper sealing portion 5; and having a groove 52 in the upper sealing portion 5, as explained in the third embodiment.

The power feeding portions 7 in a lead form is formed of a 0.3 mm thick copper alloy, and has arc portions 71 formed on the glass sealing side by a press, as shown in FIG. 13B. These arc portions 71 have respectively wire-connecting portions 70 for being electrically connected to an LED element 2 by respective wires. The wire-connecting portions 70 are formed so as to be 0.15 mm thick by etching the surface of the power feeding portions 7.

The lower sealing portion 4 has depressed portions 41 for housing the power feeding portions 7, which are formed according to the shape of the arc portions 71. The arc portions 71 are housed in the depressed portions 41, so that the wire-connecting portions 70 are thereby positioned relative to the element-mounting portion 31.

The effect of the ninth embodiment is as follows.

According to the ninth embodiment, since the power feeding portions 7 are formed of a lead made of a copper alloy, and are housed in the depressed portions 41 of the lower sealing portion 4, the positioning accuracy relative to the element-mounting portion 31 during fabrication can be enhanced. Also, since the thermocompression bonding of the power feeding portions 7 to the lower sealing portion 4 using a Cu thin film becomes unnecessary, the thermocompression bonding of the upper and lower sealing portions 5 and 4 can be facilitated.

Also, since the power feeding portions 7 are formed of a copper alloy that is soft metal, stress caused by thermal expansion/contraction is absorbed according to deformation, thereby allowing suppression of peeling, etc.

In the ninth embodiment, although no thermocompression-bonded portion 51 explained in the first embodiment, etc. is formed around the upper sealing portion 5, thermocompression-bonding can be performed without decreasing bonding strength to the lower sealing portion 4, by holding the upper sealing portion 5 with a mold so as to surround the optically shaped surface 50, followed by a heating press.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light-emitting device, comprising:
 a light-emitting portion comprising a light-emitting element;
 a heat dissipation base on which the light-emitting portion is mounted and which is exposed outwardly for dissipating heat produced by the light-emitting portion;
 a power feeding portion for feeding power to the light-emitting portion; and
 a sealing portion comprising a glass material contacting the heat dissipation base for insulating the power feeding portion from the heat dissipation base,
 wherein the sealing portion comprises:
  a first sealing portion comprised of the glass material and disposed between the heat dissipation base and the power feeding portion for insulation therebetween, said first sealing portion having at least one of a recessed portion and a groove with corrugated ridges surrounding said light-emitting element at a predetermined distance therefrom; and
  a second sealing portion comprised of the glass material and which is integrated through the power feeding portion with the first sealing portion, the glass material having light transmissivity for radiating outwardly light emitted from the light-emitting portion, and the second sealing portion is directly bonded to the first sealing portion.

2. The light-emitting device according to claim 1, wherein: the sealing portion further comprises:

a stress buffer portion that is disposed at a periphery of the light-emitting portion, the stress buffer portion being confined by the heat dissipation base and the sealing portion.

3. The light-emitting device according to claim 2, wherein: the light-emitting portion comprises the light-emitting element mounted on a submount.

4. The light-emitting device according to claim 2, wherein: the power feeding portion is in the form of a conductive thin film.

5. The light-emitting device according to claim 2, wherein: the at least one of said recessed portion and said groove with corrugated ridges comprises a suppression portion that prevents a diffusion of a buffering material to flow out from the stress buffer portion through an interface between the first and the second sealing portions.

6. The light-emitting device according to claim 2, wherein: the first sealing portion comprises a molded sealing portion.

7. The light-emitting device according to claim 1, wherein: the light-emitting portion comprises the light-emitting element mounted on a submount.

8. The light-emitting device according to claim 1, wherein: the power feeding portion is in the form of a conductive thin film, said conductive thin film extending radially outward from between said first sealing portion and said second sealing portion.

9. The light-emitting device according to claim 1, wherein: the heat dissipation base, the power feeding portion and the sealing portion have substantially a same thermal expansion coefficient.

10. The light-emitting device according to claim 1, wherein:
the power feeding portion comprises a soft metal.

11. The light-emitting device according to claim 1, wherein:
the heat dissipation base comprises a material with a thermal conductivity of 100 W/(m·K) or more.

12. The light-emitting device according to claim 11, wherein:
the heat dissipation base comprises a copper alloy.

13. The light-emitting device according to claim 1, wherein the second sealing portion is thermocompression-bonded to the first sealing portion.

* * * * *